United States Patent
Kim et al.

(10) Patent No.: US 8,415,687 B2
(45) Date of Patent: Apr. 9, 2013

(54) ORGANIC LIGHT-EMITTING DEVICE

(75) Inventors: Mi-Kyung Kim, Yongin-si (KR);
Min-Seung Chun, Yongin-si (KR);
Dong-Heon Kim, Yongin-si (KR);
Kwan-Hee Lee, Yongin-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 286 days.

(21) Appl. No.: 12/687,308

(22) Filed: Jan. 14, 2010

(65) Prior Publication Data
US 2010/0181561 A1    Jul. 22, 2010

(30) Foreign Application Priority Data
Jan. 20, 2009 (KR) .................. 10-2009-0004722

(51) Int. Cl.
*H01L 29/18* (2006.01)
(52) U.S. Cl.
USPC ............. 257/87; 257/101; 257/102; 257/642; 257/E51.018
(58) Field of Classification Search ............ 257/87, 257/101–102, 642, E51.018
See application file for complete search history.

(56) References Cited

U.S. PATENT DOCUMENTS

| 2005/0221121 A1 | 10/2005 | Ishihara et al. | |
|---|---|---|---|
| 2008/0135804 A1* | 6/2008 | Qiu et al. | 252/301.16 |
| 2008/0315763 A1* | 12/2008 | Dobbertin et al. | 313/512 |

FOREIGN PATENT DOCUMENTS

KR    10-0804533    2/2008

OTHER PUBLICATIONS

Korean Office Action issued by Korean Patent Office on Mar. 29, 2010, corresponding Korean Patent Application No. 10-2009-0004722 and Request for Entry of the Accompanying Office Action attached herewith.

* cited by examiner

*Primary Examiner* — Eugene Lee
*Assistant Examiner* — Elias M Ullah
(74) *Attorney, Agent, or Firm* — Robert E. Bushnell, Esq.

(57) ABSTRACT

An organic light emitting device with improved light emitting efficiency, the organic light emitting device includes a substrate, a first electrode arranged on the substrate, a second electrode arranged to face the first electrode, an organic light-emitting layer arranged between the first electrode and the second electrode, an electron transport layer arranged between the organic light-emitting layer and the second electrode, wherein the electron transport layer includes a multi-layer structure that includes at least one first layer and at least two second layers, wherein ones of said at least one first layer and ones of said at least two second layers are alternately stacked, wherein ones of the at least two second layers are arranged at both opposite ends of the electron transport layer, each of the at least two second layers having a lower electron mobility than that of each of the at least one first layer.

15 Claims, 6 Drawing Sheets

ORGANIC LIGHT-EMITTING DEVICE

CLAIM OF PRIORITY

This application makes reference to, incorporates the same herein, and claims all benefits accruing under 35 U.S.C. §119 from an application for ORGANIC LIGHT EMITTING DEVICE earlier filed in the Korean Intellectual Property Office on 20 Jan. 2009 and there duly assigned Serial No. 10-2009-0004722.

BACKGROUND OF THE INVENTION

1. Field of the Invention

The present invention relates to an organic light-emitting device, and more particularly, to an organic light-emitting device with low driving voltage and excellent light-emitting efficiency.

2. Description of the Related Art

Conventional display devices are being replaced with portable thin flat-panel display devices. Electroluminescent light-emitting display devices are self-luminous flat-panel display devices, and have advantages such as wide viewing angles, excellent contrast, and fast response speed. Thus, electroluminescent light-emitting display devices are being highlighted as next-generation display devices. Furthermore, organic light-emitting display devices, which include light-emitting layers made out of organic materials, have higher brightness, lower driving voltage, and quicker response speed as compared to inorganic light-emitting display devices. Also, organic light-emitting display devices can be polychromic.

An organic light-emitting display device includes an organic light-emitting device. An organic light-emitting device includes an anode, a cathode, and an intermediate layer arranged between the anode and the cathode. The intermediate layer includes an organic light-emitting layer and another organic material layer. A voltage difference is applied across the organic light-emitting layer via the anode or cathode causing the organic light-emitting layer to emit visible light.

Here, the organic material layer in the intermediate layer generally includes a plurality of layers. The plurality of organic material layers provide for easy transportation and implantation of electric charges into the organic light-emitting layer.

However, it is not easy to combine a plurality of organic material layers for high light-emitting efficiency, optimized charge balance, and long lifetime. In other words, there are limits to the extent to which the properties of an organic light-emitting device can be optimized by mutually combining a plurality of organic material layers due to the types and characteristics of the organic material layers. The electron transport layer can include only three layers.

SUMMARY OF THE INVENTION

The present invention provides an organic light-emitting device with reduced driving voltage and improved light-emitting efficiency.

According to an aspect of the present invention, there is provided an organic light-emitting device that includes a substrate, a first electrode arranged on the substrate, a second electrode arranged to face the first electrode, an organic light-emitting layer arranged between the first electrode and the second electrode, an electron transport layer arranged between the organic light-emitting layer and the second electrode, wherein the electron transport layer includes a multi-layer structure that includes at least one first layer and at least two second layers, wherein ones of said at least one first layer and ones of said at least two second layers are alternately stacked, wherein ones of the at least two second layers are arranged at both opposite ends of the electron transport layer, each of the at least two second layers having a lower electron mobility than that of each of the at least one first layer.

The organic light-emitting device can also include a hole implant layer arranged between the first electrode and the organic light-emitting layer. The organic light-emitting device can also include a hole transport layer arranged between the hole implant layer and the organic light-emitting layer. The organic light-emitting device can also include an electron implant layer arranged between the electron transport layer and the second electrode. The electron transport layer can include only three layers. The electron transport layer can include five layers. The electron transport layer can include thirteen layers.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein:

FIG. 11 is a cross sectional view of an electron transport layer of the organic light-emitting device of FIG. 9 according to another embodiment of the present invention.

DETAILED DESCRIPTION OF THE EMBODIMENTS

Figure 1:
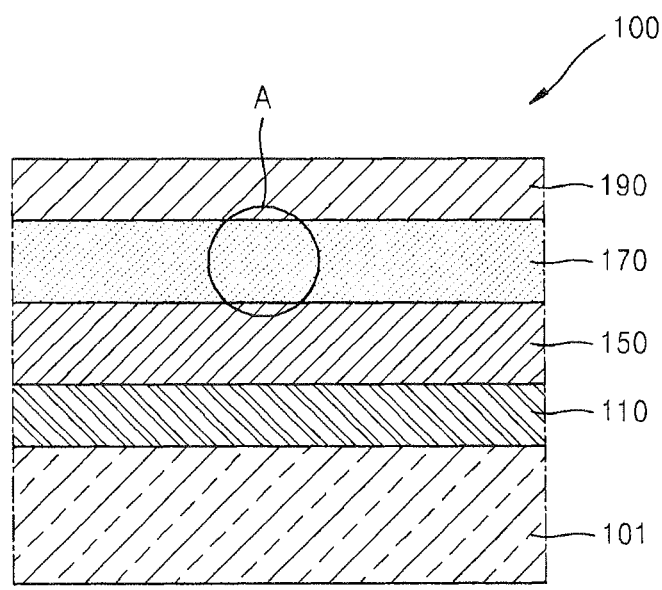
FIG. 1 is a cross-sectional view of an organic light-emitting device according to a first embodiment of the present invention.

The present invention will be described more fully hereinafter with reference to the accompanying drawings, in which exemplary embodiments of the invention are shown. As those skilled in the art would realize, the described embodiments can be modified in various different ways, all without departing from the spirit or scope of the principles for the present invention.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. Alternatively, when an element is referred to as being "directly on" another element, there are no intervening elements present.

In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

FIG. 1 is a cross-sectional view of an organic light-emitting device 100 according to a first embodiment of the present invention. Referring to FIG. 1, the organic light-emitting device 100 according to the first embodiment of the present invention includes a substrate 101, a first electrode 110, an organic light-emitting layer 150, an electron transport layer 170, and a second electrode 190.

The substrate 101 can be a transparent glass of which the main ingredient is $SiO_2$, however the present invention is not limited thereto, and the substrate 101 can instead be made out of a transparent plastic. If substrate 101 is plastic, the plastic can be an insulating organic material, such as polyethersulphone (PES), polyacrylate (PAR), polyetherimide (PEI), polyethylene napthalate (PEN), polyethyeleneterepthalate (PET), polyphenylene sulfide (PPS), polyallylate, polyimide, polycarbonate (PC), cellulose tree acetate (TAC), or cellulose acetate propionate (CAP), however the present invention is not limited thereto, and the substrate 101 can also be made out of a metal and still be within the scope of the present invention.

If the organic light-emitting device 100 is a bottom emission type organic light-emitting device in which images are projected through the substrate 101, it is necessary for the substrate 101 to be made out of a transparent material. However, if the organic light-emitting device 100 is a top emission type organic light-emitting device in which images are projected in a direction away from the substrate 101, it is not necessary for the substrate 101 to be transparent. In the latter case, the substrate 101 can be made out of a metal. When made out of a metal, the substrate 101 can contain one or more of carbon, iron, chrome, manganese, nickel, titanium, molybdenum, stainless steel (SUS), Invar alloy, Inconel alloy, and Kovar alloy, however the present invention is not limited to the metals stated above. The substrate 101 can also be made out of a metal foil.

A buffer layer (not shown) can be formed on the top surface of the substrate 101 to prevent osmosis of impure elements into the substrate 101 and to provide for a flat surface over the substrate 101.

The first electrode 110 can be formed on the substrate 101. The first electrode 110 can have a predetermined pattern that is produced via a photolithography technique. The first electrode 110 can be either a transparent electrode or a reflective electrode. If the first electrode 110 is a transparent electrode, the first electrode 110 can be made out of ITO, IZO, ZnO, or $In_2O_3$. If the first electrode 110 is a reflective electrode, the first electrode 110 can include a reflective layer that includes one or more of Ag, Mg, Al, Pt, Pd, Au, Ni, Nd, Ir, Cr, or a compound thereof and transparent layer that includes one or more of ITO, IZO, ZnO, or $In_2O_3$. The surface of the first electrode 110 can be ultraviolet-ray/ozone treated to reduce contact resistance between the first electrode 110 and the organic light-emitting layer 150 formed thereon.

The organic light-emitting layer 150 is formed on the first electrode 110. The organic light-emitting layer 150 contains either a small molecular organic material or a polymer organic material. For example, the organic light-emitting layer 150 can contain a blue organic material, such as oxadiazole dimer dyes (Bis-DAPDXP), Spiro compounds (Spiro-DPVBi, Spiro-6P), triarylamine compounds, bis (styryl)amine (DVPBi, DSA), 4,4'-bis(9-ethyl-3-carbazovinylene)-1-1'-bisphenyl (BCzVBi), perylene, 2,5,8,11-tetra-tert-butylphenylen (TPBe), 9H-carbazole,3,3'-(1,4-phenylenedi-2,1-ethenediyl)bis[9-ethyl-(9c) (BCzVB), 4,4'-Bis[4-(di-p-tolylamino)styryl]biphenyl (DPAVBi), 4-(di-p-tolyamino)-4'-[(di-p-tolyamino)styril]stilbene (DPAVB), 4,4'-Bis(4-(diphenylamino)styryl)biphenyl (BDAVBi), Bis (3,5-difluoro-2-(2-pyridyl)phenyl-(2-carboxypyridyl)iridium(III) (FlrPic), etc., a green organic material, such as 3-(2-Benzothiazolyl)-7-(diethyl-amino)coumarin (coumarin 6), 2,3,6,7-tetrahydro-1,1,7,7,-tetramethyl-1H,5H,11H-10-(2-benzothiazolyl) quinolizino-[9,9a,1gh]coumarin (C545T), N,N'-dimethyl-quinacridone (DMQA), tris(2-phenylpyridine)iridium(III) (Ir(ppy)$_3$), or the like, and a red organic material, such as Tetraphenylnaphthacene (Rubrene), tris(1-phenylisoquinoline)iridum(III) (Ir(piq)$_3$), Bis(2-benzo[1,1]thiophen-2-yl-pyridine)(acetylacetonate)iridium(III) (Ir(btp)$_2$(acac)), tris(dibenzoylmethan)(phenanthroline)europium(III) (Eu(dbm)$_3$(phen)), tris[4,4'-di-tert-butyl-(2,2)-bipyridine]ruthenium(III) complex (Ru(dtb-bpy)$_3$,2(PF$_6$)), DCM1, DCM2, Eu(thenoylfluoroacetone)3(Eu(TTA)3, butyl-6-(1,1,7,7-tetramethyljulolidyl-9-enyl)-4H-pyran (DCJTB), or the like.

Furthermore, the organic light-emitting layer 150 can contain an aromatic compound that contains a polymer and nitrogen, wherein examples of the polymer can include phenylene-based polymers, phenylene vinylene-based polymers, thiophene-based polymers, fluorine-based polymers, spirofluorene-based polymers, etc, but the present invention is in no way so limited.

If required, the organic light-emitting layer 150 can be produced by adding a dopant to a host. The host can be a light-emitting host or a phosphoric host. Examples of the light-emitting host can include tris(9-hydroxy-quinolinato) aluminum (Alq$_3$), 9,10-di(2-naphth-2-yl)anthracene (ADN), 3-tert-buthyl-9,10-di(2-naphth-2-yl)anthracene (TBADN), 4,4'-bis(2,2-diphenyl-ethene-1-yl)-4,4'-dimethylphenyl (DPVBi), (p-DMDPVBi), tert(9,9-diarylfluorene)s (TDAF), 2-(9,9'-spirobifluorene-2-yl)-9,9'spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-buthyl)phenyl (p-TD- PVBi), etc. Examples of the phosphoric host can include 1,3-bis(carbazole-9-yl)benzene (mCP), 1,3,5-tris(carbazole-9-yl)benzene (tCP), 4,4',4"-tris(carbazole-9-yl)triphenylamine (TcTa), 4-4'-bis(carbazole-9-yl)biphenyl (CBP), 4,4'-bis[bis(9-carbazolyl)]-2,2'-dimethyl-biphenyl (CBDP), 4,4'-bis(carbazole-9-yl)-9,9'-dimethyl-fluorene (DMFL-CBP), 4,4'-bis(carbazole-9-yl)-9,9-bis[bis(9-phenyl-9H-carbazole)]fluorene (FL-4CBP), 4,4'-bis(carbazole-9-yl)-9,9-ditolyl-fluorene (DPFL-CBP), 9,9-bis(9-phenyl-9H-carbazole) fluorene (FL-2CBP), etc. The content of the dopant can vary according to a material constituting the organic light-emitting layer 150.

Figure 2:
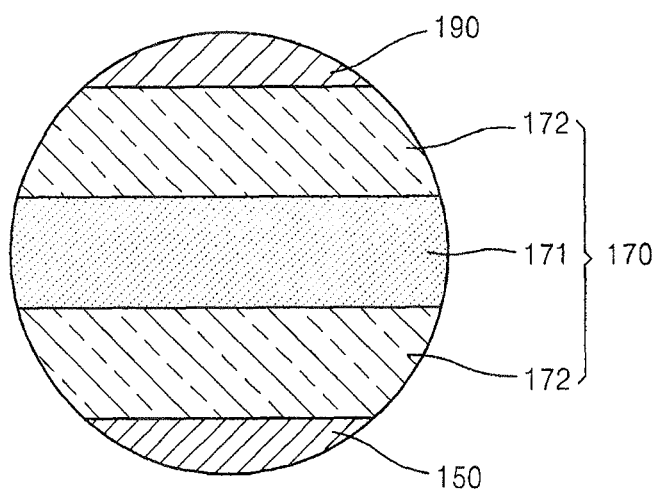
FIG. 2 is a cross-sectional view of the electron transport layer of the organic light-emitting device of FIG. 1.

The electron transport layer 170 is formed on the organic light-emitting layer 150. FIG. 2 is a cross-sectional view of the electron transport layer 170 according to the first embodiment of the present invention. Referring to FIG. 2, the electron transport layer 170 according to the first embodiment includes a first layer 171 and two second layers 172. The second layers 172 are formed to have lower electron mobility than that of the first layer 171. Referring to FIG. 2, one of the second layers 172 is formed on the organic light-emitting layer 150, the first layer 171 is formed on the second layer 172, and the other of the second layer 172 is formed on the first layer 171 so that first layer 171 is arranged between the two second layers 172.

The electron transport layer 170 according to the first embodiment of the present invention includes three layers, and thus it is easy to adjust the charge balance in the organic light-emitting layer 150. In other words, it is easy to adjust the speed of electrons transmitted to the organic light-emitting layer 150 via the electron transport layer 170 by having many layers in the electron transport layer 170. In particular, ones of the second layers 172 are respectively arranged between the first layer 171 and the organic light-emitting layer 150, and between the first layer 171 and the second electrode 190. The second layers 172 can be made out of a material having a lower electron mobility than the material constituting the first layer 171 to compensate for fast electron movement in the first layer 171.

The first layer 171 and the second layers 172 can be made out of any material as along as the material constituting the second layers 172 have lower electron mobility than the material constituting the first layer 171. Furthermore, each of the second layers 172 can differ from each other. For example, the second layer 172 interposed between the first layer 171 and the organic light-emitting layer 150 can be made out of a material different from a material constituting the second layer 172 interposed between the first layer 171 and the second electrode 190.

Accordingly, electron mobility in the electron transport layer 170 can be freely adjusted, and thus the charge balance in the organic light-emitting layer 150 can be easily adjusted. As a result, the organic light-emitting device 100 according to the first embodiment of the present invention has excellent light-emitting efficiency and long lifetime.

The electron transport layer 170 can be produced via a deposition method. In a case where the electron transport layer 170 is produced in a single chamber, a source unit, which includes a material for producing the first layer 171 and a material for producing the second layer 172, are arranged in the chamber. Then, a second layer 172, the first layer 171, and the other second layer 172 can be easily and sequentially deposited by moving the source unit back and forth in the chamber. Alternatively, with the source unit being fixed, the substrate 101 can be put on a carrier, and a second layer 172, the first layer 171, and the other second layer 172 can be sequentially deposited by moving the carrier back and forth.

However, the present invention is not limited to these techniques. In other words, various other techniques and apparatuses for producing thin-films can be used to form the first layer 171 and the second layers 172 and still be within the scope of the present invention.

The second electrode 190 is formed on the electron transport layer 170. The second electrode 190 can be a transparent electrode or a reflective electrode. If the second electrode 190 is a transparent electrode, the second electrode 190 can be produced by depositing a transparent conductive material, such as ITO, IZO, ZnO or $In_2O_3$ on the electron transport layer 170 and forming either an assistant electrode or a bus electrode line using Li, Ca, LiF/Ca, LiF/Al, Al, Mg, or a compound thereof. If the second electrode 190 is a reflective electrode, the second electrode 190 can be produced by depositing Li, Ca, LiF/Ca, LiF/Al, Al, Mg, or a compound thereof on the electron transport layer 170.

Although not shown, the organic light-emitting device 100 can also include a sealing member (not shown). The sealing member can be formed on the second electrode 190. The sealing member is included to protect the organic light-emitting device 100 from external moisture, oxygen, etc. If the organic light-emitting device 100 is a top emission type organic light-emitting device, the sealing member is made out of a transparent material. In this regard, the sealing member can be made out of a glass substrate, a plastic substrate, or a stack structure of organic materials and inorganic materials.

Figure 3:
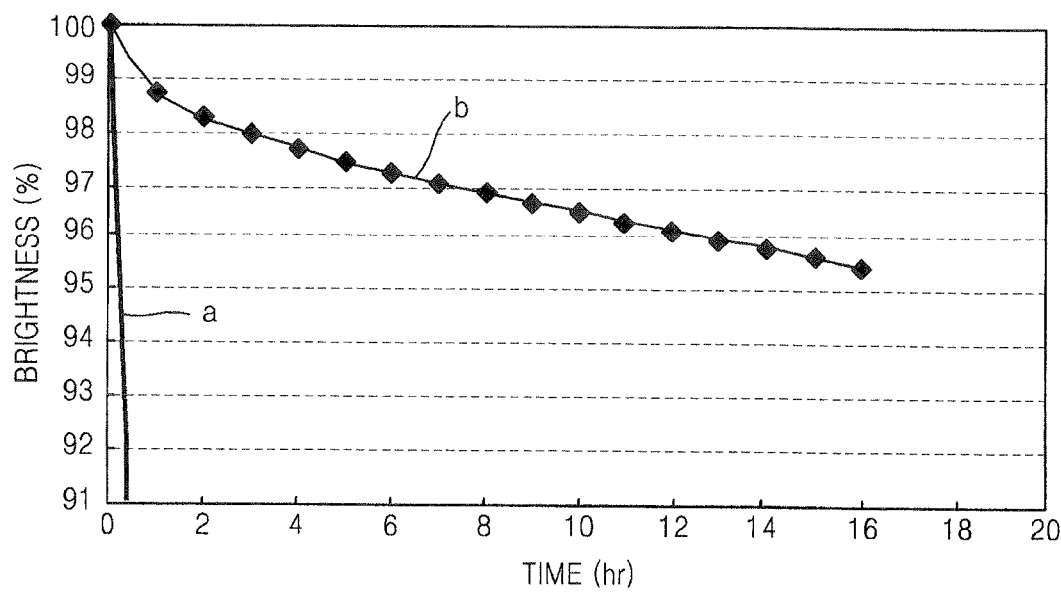
FIG. 3 is a graph showing comparison of the lifetime of an organic light-emitting device according to the present invention and the lifetime of a conventional organic light-emitting device.

FIG. 3 is a graph showing comparison of the lifetime of an organic light-emitting device according to the present invention and the lifetime of a conventional organic light-emitting device. In FIG. 3, curve (a) indicates the conventional organic light-emitting device including an electron transport layer having a single-layer structure, and curve (b) indicates an organic light-emitting device according to the present invention.

Referring to FIG. 3, curve (a) shows that the brightness of the conventional organic light-emitting device is decreased by 10% as compared to the initial brightness of the same in less than one hour. Meanwhile, curve (b) shows that the brightness of the organic light-emitting device according to the present invention is decreased by only 4.5% as compared to the initial brightness of the same after 16 hours. Thus, it is clear that the organic light-emitting device according to the present invention exhibits less brightness decrease as compared to a conventional organic light-emitting device, and thus the organic light-emitting device according to the present invention has a longer lifetime.

According to the first embodiment of the present invention, the electron transport layer 170 can be formed by repeatedly stacking the first layer 171 and the second layer 172. In other words, although FIG. 2 illustrates a structure in which the first layer 171, the second layer 172, and the first layer 171 are sequentially stacked in a triple-layer structure, however the present invention is not limited thereto. The first layer 171 and the second layer 172 can be further stacked in a multi-layer structure to include four or more layers and still be within the scope of the present invention. A result of an experiment related thereto is shown in FIG. 4.

Figure 4:
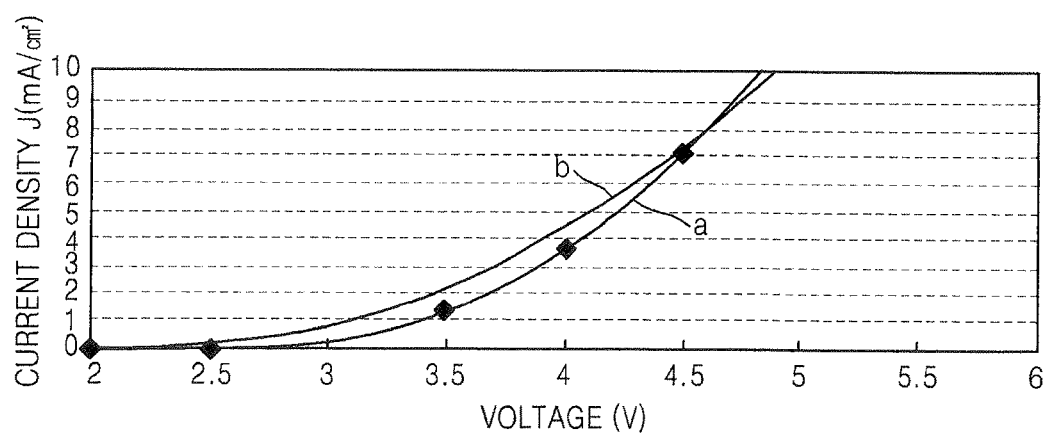
FIG. 4 is a graph showing current density according to driving voltage in an organic light-emitting device according to another embodiment of the present invention, and current density according to driving voltage of a conventional organic light-emitting device.

FIG. 4 is a graph showing current density according to driving voltage in an organic light-emitting device according to another embodiment of the present invention and current density according to driving voltage of a conventional organic light-emitting device. In this regard, the organic light-emitting device according to the present invention includes an electron transport layer 170 having a nonuple-layer (or 9-layered) structure where the first layer 171 and the second layer 172 are stacked in a sequence of second layer 172, first layer 171, second layer 172, first layer 171, second layer 172, first layer 171, second layer 172, first layer 171 and second layer 172. The conventional organic light-emitting device used to produce curve (a) in FIG. 4 includes an electron transport layer having a double-layer structure. In FIG. 4, curve (a) indicates the conventional organic light-emitting device electron transport, and curve (b) indicates the organic light-emitting device according to the present embodiment as described above.

Referring to FIG. 4, curve (b) indicates reduced driving voltage and increased current density as compared to curve (a). This is because the charge balance of the organic light-emitting device according to the present invention is effectively adjusted. Thus, overall light-emitting efficiency and lifetime of the organic light-emitting device according to the present invention are better than those of the conventional organic light-emitting device.

Figure 5:
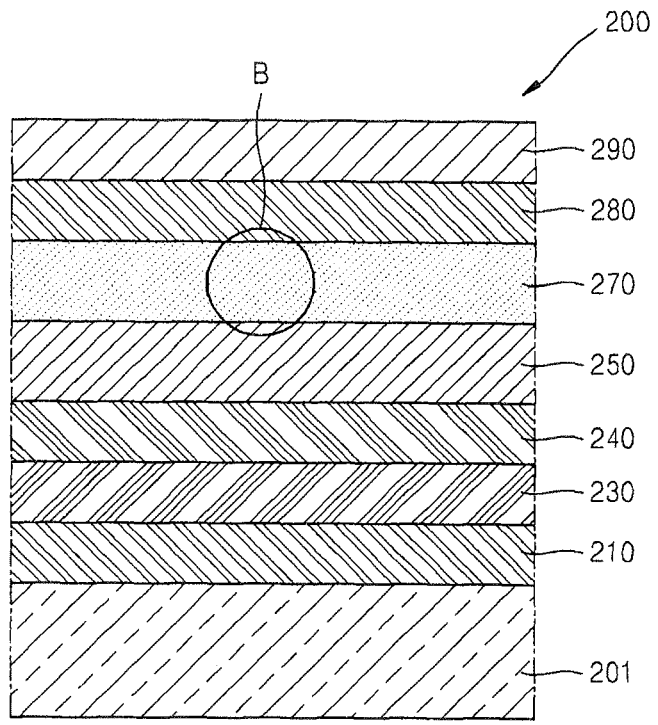
FIG. 5 is a cross-sectional view of an organic light-emitting device according to a second embodiment of the present invention.
Figure 6:
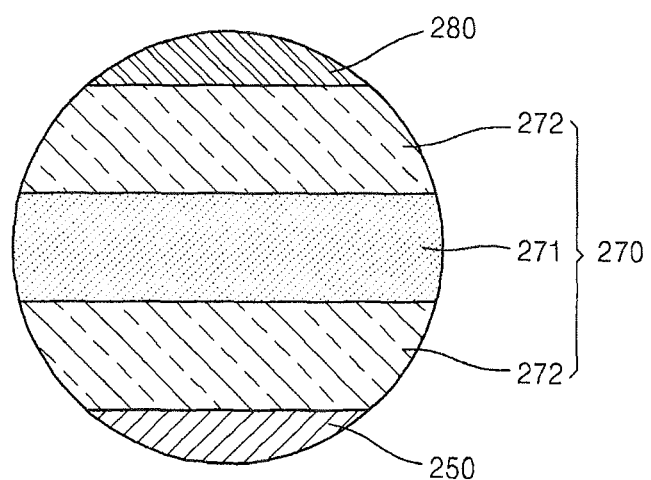
FIG. 6 is a cross-sectional view of an electron transport layer of the organic light-emitting device of FIG. 5.

Turning now to FIGS. 5 and 6, FIG. 5 is a cross-sectional view of an organic light-emitting device 200 according to a second embodiment of the present invention, and FIG. 6 is a cross-sectional view of an electron transport layer 270 of the organic light-emitting device 200 of FIG. 5. Referring to FIG. 5, the organic light-emitting device 200 according to the second embodiment includes a substrate 201, a first electrode 210, a hole implant layer 230, a hole transport layer 240, an organic light-emitting layer 250, the electron transport layer 270, an electron implant layer 280, and a second electrode 290. For convenience of explanation, descriptions below will focus on differences between the second embodiment and the first embodiment illustrated in FIGS. 1 and 2.

As compared to the organic light-emitting device 100 of FIGS. 1 and 2, the organic light-emitting device 200 according to the second embodiment further includes the hole implant layer 230, the hole transport layer 240, and the electron implant layer 280. The hole implant layer 230, the hole transport layer 240, and the electron implant layer 280 can either be all included or be selectively included in the organic light-emitting device 200 according to the second embodiment.

The first electrode 210 is formed on the substrate 201, and the hole implant layer 230 is formed on the first electrode 210. The hole implant layer 230 can be made out of various organic materials, wherein examples of the organic materials can include phthalocyanine compounds such as copper phthalocyanine, or starburst amine derivatives such as TCTA, m-MTDATA, m-MTDAPB, etc. The hole implant layer 230 can be produced using a technique such as vacuum thermal deposition, spin coating, or the like.

The hole transport layer 240 is formed on the hole implant layer 230. Although the hole transport layer 240 can be produced using various techniques such as vacuum deposition, spin coating, casting, Langmuir Blodgett (LB) deposition, etc., it is preferable to use vacuum deposition. By using vacuum deposition, it is easy to obtain a uniform film and pin holes are unlikely to be formed. If a hole transport layer is formed using vacuum deposition, deposition conditions vary according to compounds used, but are generally selected within a range of conditions used to form the hole implant layer 230. The hole transport layer 240 can be made of various materials, such as N,N'-bis(3-methylphenyl)-N,N'-diphenyl-[1,1-biphenyl]-4,4'-diamine (TPD), N'-di(naphthalene-1-yl)-N,N'-diphenylbenzidine (a-NPD), etc.

The organic light-emitting layer 250 is formed on the hole transport layer 240. Since the configuration of the organic light-emitting layer 250 according to the second embodiment is identical to that of the organic light-emitting layer 150 of FIG. 1, a detailed description thereof will not be repeated here.

The electron transport layer 270 is formed on the organic light-emitting layer 250. As in the first embodiment, the electron transport layer 270 according to the second embodiment includes a first layer 271 and two second layers 272. The second layers 272 are have lower electron mobility than that of the first layer 271. Referring to FIG. 6, a second layer 272 is formed on the organic light-emitting layer 250, the first layer 271 is formed on the second layer 272, and another second layer 272 is formed on the first layer 271 so that the first layer 271 is sandwiched between the two second layers 272.

As with the electron transport layer 170 illustrated in FIG. 2, the electron transport layer 270 includes a plurality of layers, so that it is easy to adjust the charge balance in the organic light-emitting layer 250. The first layer 271 and the second layers 272 can be made out of any materials as along as the material constituting the second layers 272 have lower electron mobility than the material constituting the first layer 271. Furthermore, each of the second layers 272 can differ from each other. For example, the second layer 272 interposed between the first layer 271 and the organic light-emitting layer 250 can be made out of a material different from the material constituting the second layer 272 interposed between the first layer 271 and the electron implant layer 280.

The electron implant layer 280 is formed on the electron transport layer 270. The electron implant layer 280 can be made out of various materials, such as LiF, NaCl, CsF, $Li_2O$, BaO, etc. Conditions for forming the electron implant layer 280 vary according to compounds used, but are generally selected within the range of conditions used to form the hole implant layer 230. The second electrode 290 is formed on the electron implant layer 280. Although not shown, a sealing member can be arranged on the second electrode 290.

Figure 7:
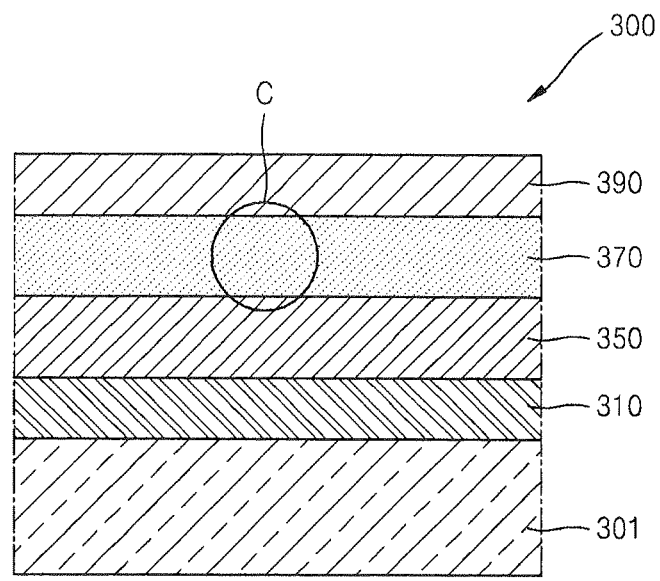
FIG. 7 is a cross-sectional view of an organic light-emitting device according to a third embodiment of the present invention.
Figure 8:
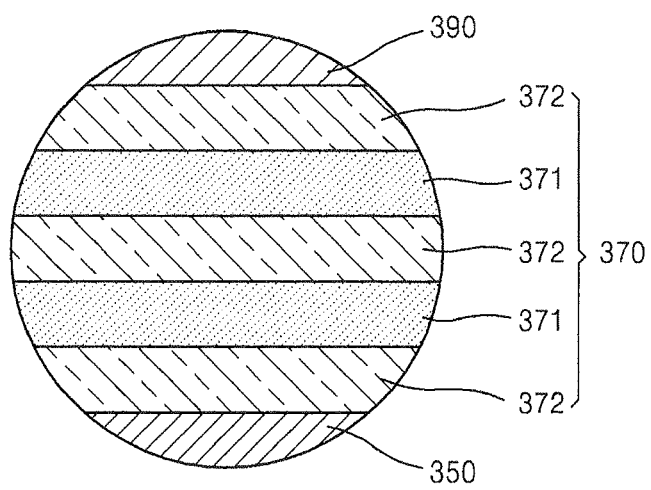
FIG. 8 is a cross-sectional view of an electron transport layer of the organic light-emitting device of FIG. 7.

Turning now to FIGS. 7 and 8, FIG. 7 is a cross-sectional view of an organic light-emitting device 300 according to a third embodiment of the present invention and FIG. 8 is a cross-sectional view of an electron transport layer 370 of the organic light-emitting device 300. Referring to FIG. 7, the organic light-emitting device 300 according to the third embodiment includes a substrate 301, a first electrode 310, an organic light-emitting layer 350, an electron transport layer 370, and a second electrode 390. For convenience of explanation, descriptions below will focus on differences between the current third embodiment and the previous embodiments. As compared to the organic light-emitting 100 illustrated in FIG. 1, the electron transport layer 370 of the organic light-emitting device 300 according to the third embodiment has a different configuration.

The first electrode 310 is formed on the substrate 301, and the organic light-emitting layer 350 is formed on the first electrode 310. The configuration of the organic light-emitting layer 350 is same as in the previous embodiments, and thus a detailed description thereof will not be repeated here.

The electron transport layer 370 is formed on the organic light-emitting layer 350. The electron transport layer 370 includes two first layers 371 and three second layers 372, but the present invention is in no way so limited. The second layers 372 have lower electron mobility than that of the first layers 371. The first layers 371 and the second layers 372 are formed on the organic light-emitting layer 350 in a sequence of the second layer 372, the first layer 371, the second layer 372, the first layer 371, and the second layer 372.

The electron transport layer 370 according to the third embodiment includes five layers, and thus it is easy to adjust the charge balance in the organic light-emitting layer 350. In other words, it is easy to adjust the speed of electrons transmitted to the organic light-emitting layer 350 via the electron transport layer 370.

Furthermore, as compared to the first embodiment illustrated in FIG. 1, the electron transport layer 370 according to the third embodiment includes two more layers, and thus more interfaces between ones of the first layers 371 and the ones of the second layers 372 are formed in the electron transport layer 370. The speed of moving electrons changes at the interfaces between ones of the first layers 371 and corresponding ones of the second layers 372, each of which has different electron mobility. The moving speed of electrons can be adjusted at the interfaces, and movement of electrons can be controlled more precisely as the number of interfaces increases. Thus, the charge balance can be easily adjusted.

The first layers 371 and the second layers 372 can be made out of any materials as long as the material constituting the second layers 372 have lower electron mobility than that of a material constituting the first layers 371. Furthermore, each of the second layers 372 can differ from each other. In other words, each of the three second layers 372 can be made out of different organic materials. Similarly, each of the two first layers 371 can also be made out of different organic materials. Movement of electrons can be precisely controlled by using various materials as described above, and thus the charge balance in the organic light-emitting layer 350 can be easily adjusted. Furthermore, the organic light-emitting device 300 illustrated in FIG. 7 has excellent light-emitting efficiency and long lifetime due to optimized charge balance in the organic light-emitting layer 350.

After forming the electron transport layer 370, the second electrode 390 is then formed on the electron transport layer 370. Although not shown, a sealing member can be arranged on the second electrode 390 to complete the organic light-emitting device according to the third embodiment of the present invention.

Figure 11:
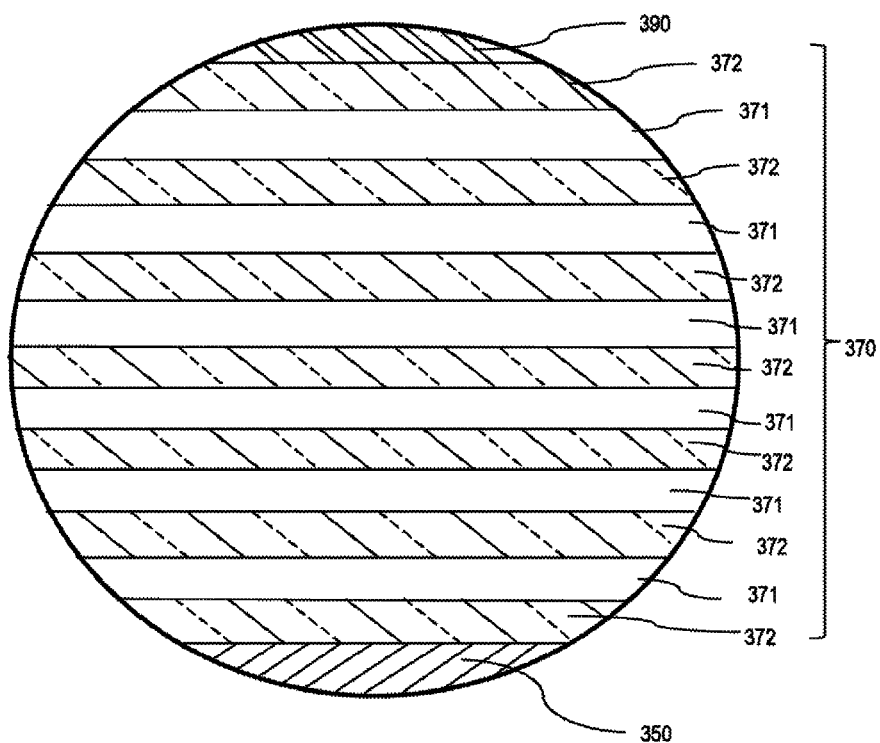
FIG. 11 is another cross-sectional view of an electron transport layer of the organic light-emitting device of FIG. 7.

Although FIG. 8 illustrates the electron transport layer 370 as having a quintuple-layer structure, in which the second layer 372, the first layer 371, the second layer 372, the first layer 371, and the second layer 372 are sequentially stacked, the present invention is in no way so limited. In other words, as described above with reference to FIG. 4, the electron transport layer 370 can instead include 9 layers, that is, the second layer 372, the first layer 371, the second layer 372, the first layer 371, the second layer 372, the first layer 371, the second layer 372, the first layer 371, and the second layer 372, or more e.g. 11 layers, 13 layers, or the like and still be within the scope of the present invention. FIG. 11 illustrates the electron transport layer 370 as having a 13-layer structure, in which the second layer 372, the first layer 371, the second layer 372, the first layer 371, the second layer 372, the first layer 371, the second layer 372, the first layer 371, the second layer 372, the first layer 371, the second layer 372, the first layer 371, and the second layer 372 are sequentially stacked.

Figure 9:
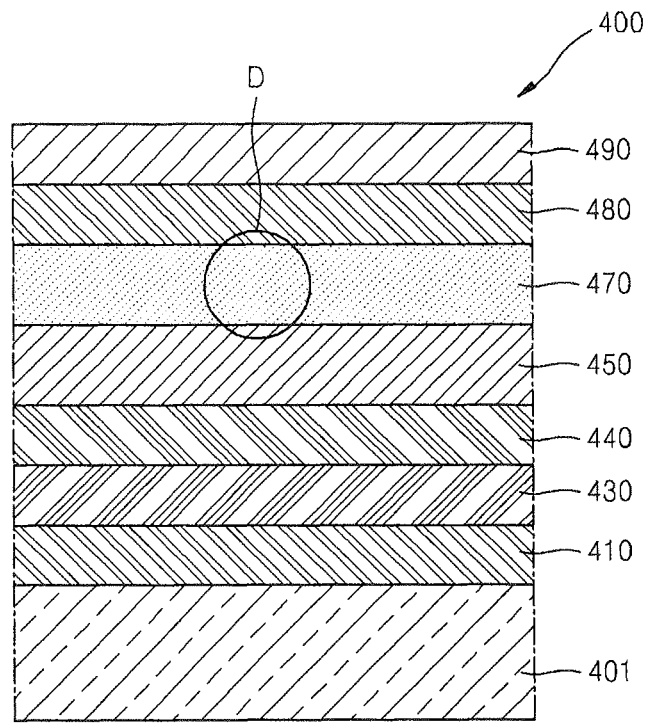
FIG. 9 is a cross-sectional view of an organic light-emitting device according to a fourth embodiment of the present invention.
Figure 10:
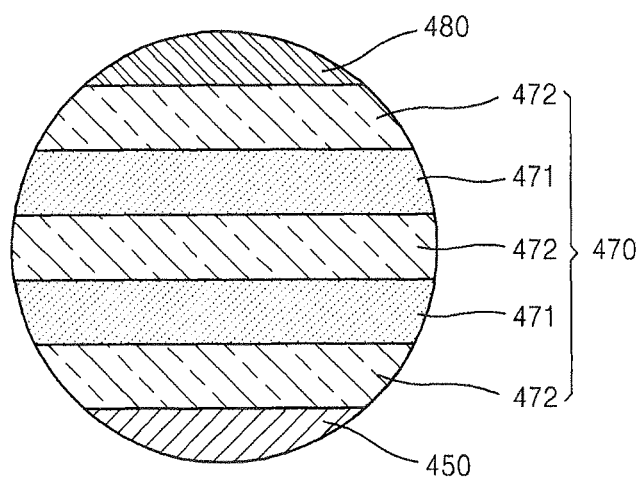
FIG. 10 is a cross-sectional view of an electron transport layer of the organic light-emitting device of FIG. 9.

Turning now to FIGS. 9 and 10, FIG. 9 is a cross-sectional view of an organic light-emitting device 400 according to a fourth embodiment of the present invention and FIG. 10 is a cross-sectional view of an electron transport layer 470 of the organic light-emitting device 400. The organic light-emitting device 400 according to the fourth embodiment includes a substrate 401, a first electrode 410, a hole implant layer 430, a hole transport layer 440, an organic light-emitting layer 450, the electron transport layer 470, an electron implant layer 480, and a second electrode 490. For convenience of explanation, descriptions below will focus on differences between the current fourth embodiment and the previous embodiments. Like the organic light-emitting device 200 of FIG. 5, the organic light-emitting device 400 according to the fourth embodiment includes the hole implant layer 430, the hole transport layer 440, and the electron implant layer 480.

The first electrode 410 is formed on the substrate 401, and the hole implant layer 430 is formed on the first electrode 410. The hole implant layer 430 can be made out of various organic materials, wherein examples of the organic materials can include phthalocyanine compounds such as copper phthalocyanine, or starburst amine derivatives such as TCTA, m-MT-DATA, m-MTDAPB, etc. The hole implant layer 430 can be produced via a technique such as vacuum thermal deposition, spin coating, or the like.

The hole transport layer 440 is formed on the hole implant layer 430. Although the hole transport layer 440 can be produced using various techniques such as vacuum deposition, spin coating, casting, LB deposition, etc., it is preferable to use the vacuum deposition technique. By using vacuum deposition, it is easy to obtain a uniform film and pin holes are unlikely to form. If a hole transport layer is produced using vacuum deposition, deposition conditions can vary according to compounds used, but are generally selected within a range of conditions almost the same as those used to form the hole implant layer 430.

The hole transport layer 440 can be made out of various materials, such as N,N-bis(3-methylphenyl)-N,N'-diphenyl-[1,1-biphenyl]-4,4-diamine (TPD), N'-di(naphthalene-1-yl)-N,N'-diphenylbenzidine (a-NPD), etc.

The organic light-emitting layer 450 is formed on the hole transport layer 440. Since the configuration of the organic light-emitting layer 450 according to the fourth embodiment is identical to that of the organic light-emitting layers 150, 250, and 350 according to the first through third embodiments, detailed descriptions thereof will not be repeated here.

The electron transport layer 470 is formed on the organic light-emitting layer 450. Like the organic light emitting device 300 of FIGS. 7 and 8, the electron transport layer 470 according to the fourth embodiment of the present invention includes a plurality of first layers 471 and a plurality of second layers 472. The second layers 472 are formed to have lower electron mobility than that of the first layers 471. The first layers 471 and the second layers 472 are formed on the organic light-emitting layer 450 in a sequence of the second layer 472, the first layer 471, second layer 472, the first layer 471, and second layer 472.

Although FIG. 10 illustrates the electron transport layer 470 as having a quintuple-layer structure, in which the second layer 472, the first layer 471, the second layer 472, the first layer 471, and the second layer 472 are stacked, the present invention is not limited thereto. In other words, the electron transport layer 470 can include 9 layers, that is, the second layer 472, the first layer 471, the second layer 472, the first layer 471, the second layer 472, the first layer 471, the second layer 472, the first layer 471, and the second layer 472, or more; e.g. 11 layers, 13 layers, or the like and still be within the scope of the present invention. FIG. 11 shows the scenario where the electron transport layer 470 includes 13 layers.

After forming the electron transport layer 470, the electron implant layer 480 is then formed on the electron transport layer 470. The electron implant layer 480 can be made out of various materials, such as LiF, NaCl, CsF, $Li_2O$, BaO, etc. Conditions for forming the electron implant layer 480 vary according to compounds used, but are generally selected within a range of conditions used to form the hole implant layer 430. The second electrode 490 is then formed on the electron implant layer 480. Although not shown, a sealing member can be arranged on the second electrode 490 to complete the formation of the organic light-emitting device 400.

As with the third embodiment, the electron transport layer 470 includes five layers so that it is easy to adjust the charge balance in the organic light-emitting layer 450. As a result, the organic light-emitting device 400 according to the fourth embodiment has excellent light-emitting efficiency and long lifetime.

The organic light-emitting devices according to the embodiments of the present invention are characterized by having low driving voltage and excellent light-emitting efficiency.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light-emitting device, comprising:
a substrate;
a first electrode arranged on the substrate;
a second electrode arranged to face the first electrode;
an organic light-emitting layer arranged between the first electrode and the second electrode; and
an electron transport layer arranged between the organic light-emitting layer and the second electrode, wherein
the electron transport layer comprises a multi-layer structure comprising at least one of first layers and at least two of second layers, wherein
ones of said at least one of first layers and ones of said at least two of second layers are alternately and sequentially stacked;
ones of the at least two of second layers are arranged at both opposite ends of the electron transport layer;
each of the at least two of second layers has a lower electron mobility than that of each of the at least one of first layers; and
each of the first layers and the second layers is embodied as the electron transport layer.

2. The organic light-emitting device of claim 1, further comprising a hole implant layer arranged between the first electrode and the organic light-emitting layer.

3. The organic light-emitting device of claim 2, further comprising a hole transport layer arranged between the hole implant layer and the organic light-emitting layer.

4. The organic light-emitting device of claim 1, further comprising an electron implant layer arranged between the electron transport layer and the second electrode.

5. The organic light-emitting device of claim 1, wherein the electron transport layer comprises only three layers.

6. The organic light-emitting device of claim 1, wherein the electron transport layer comprises five layers.

7. The organic light-emitting device of claim 1, wherein the electron transport layer comprises thirteen layers having a 13-layered structure, wherein the first layer and the second layer are stacked in a sequence of the second layer, the first layer, the second layer, the first layer, the second layer, the first layer, the second layer, the first layer, the second layer, the first layer, the second layer, the first layer, and the second layer.

8. The organic light-emitting device of claim 1, wherein the at least one first layer and the at least two second layers are arranged within the electron transport layer, the electron transport layer being bounded by ones of the at least two second layers.

9. An organic light-emitting device, comprising:
a substrate;
a first electrode arranged on the substrate;
an organic light-emitting layer arranged on the first electrode;
an electron transport layer arrangement arranged on the organic light-emitting layer; and
a second electrode arranged on the electron transport layer arrangement, wherein
the electron transport layer arrangement comprises a first second layer arranged on the first electrode, a first first layer arranged on the first second layer, and a second second layer arranged on the first first layer; each of the second layers has a lower electron mobility than the first layer; and each of the first layer and the second layers is embodied as the electron transport layer.

10. The organic light-emitting device of claim 9, the second electrode being arranged on the second second layer.

11. The organic light-emitting device of claim 9, further comprising:
a second first layer arranged on the second second layer; and
a third second layer arranged on the second first layer.

12. The organic light-emitting device of claim 9, the second second layer is comprised of a different material than the first second layer.

13. The organic light-emitting device of claim 11, each of the first, second and third second layers being comprised of different materials from each other.

14. The organic light-emitting device of claim 9, further comprising a hole implant layer and a hole transport layer arranged between the first electrode and the organic light-emitting layer.

15. The organic light-emitting device of claim 9, further comprising an electron implant layer arranged between the electron transport layer arrangement and the second electrode.

* * * * *